United States Patent
Sugiura et al.

(10) Patent No.: US 10,804,237 B2
(45) Date of Patent: Oct. 13, 2020

(54) SEMICONDUCTOR DEVICE

(71) Applicant: DENSO CORPORATION, Kariya, Aichi-pref. (JP)

(72) Inventors: Kazuhiko Sugiura, Kariya (JP); Tomohito Iwashige, Kariya (JP); Jun Kawai, Kariya (JP)

(73) Assignee: DENSO CORPORATION, Kariya (JP)

( * ) Notice: Subject to any disclaimer, the term of this patent is extended or adjusted under 35 U.S.C. 154(b) by 43 days.

(21) Appl. No.: 16/353,525

(22) Filed: Mar. 14, 2019

(65) Prior Publication Data

US 2019/0214360 A1  Jul. 11, 2019

Related U.S. Application Data

(63) Continuation of application No. PCT/JP2017/039798, filed on Nov. 2, 2017.

(30) Foreign Application Priority Data

Nov. 10, 2016 (JP) ................. 2016-219745

(51) Int. Cl.
*H01L 23/48* (2006.01)
*H01L 23/52* (2006.01)
*H01L 29/40* (2006.01)
*H01L 23/00* (2006.01)
*H01L 23/367* (2006.01)
(Continued)

(52) U.S. Cl.
CPC ............ *H01L 24/32* (2013.01); *B22F 1/0059* (2013.01); *B22F 7/064* (2013.01); *B22F 7/08* (2013.01); *H01B 1/22* (2013.01); *H01L 21/52* (2013.01); *H01L 23/3675* (2013.01); *H01L 23/48* (2013.01); *H01L 24/83* (2013.01); *C22C 1/05* (2013.01); *H01L 23/051* (2013.01); *H01L 23/367* (2013.01); *H01L 23/3677* (2013.01); *H01L 2224/325* (2013.01); *H01L 2224/33* (2013.01); *H01L 2224/8384* (2013.01); *H01L 2924/0455* (2013.01); *H01L 2924/04563* (2013.01); *H01L 2924/0535* (2013.01); *H01L 2924/0536* (2013.01)

(58) Field of Classification Search
CPC .......... H01L 24/29; H01L 2224/29499; H01L 2224/29439; C09J 9/02; C09J 11/00
USPC .......... 257/735, 736, 782, 783; 438/118, 119
See application file for complete search history.

(56) References Cited

U.S. PATENT DOCUMENTS 6,823,915 B2 * 11/2004 Schwarzbauer .... H01L 23/3737
156/349
7,262,511 B2 * 8/2007 Osako .................... H01L 24/29
252/512
(Continued)

FOREIGN PATENT DOCUMENTS

JP H01-298125 A 12/1989
JP H01-307114 A 12/1989
(Continued)

*Primary Examiner* — S. V. Clark
(74) *Attorney, Agent, or Firm* — Posz Law Group, PLC

(57) ABSTRACT

A semiconductor device includes: a mounting member having an electrode; a conductive member facing the electrode; and a bonding member electrically and mechanically connecting the electrode and the conductive member. The bonding member is made of a sintered body in which an additive particle including a metal atom having aggregation energy higher than a silver atom is added to an silver particle.

4 Claims, 6 Drawing Sheets

(51) Int. Cl.
*B22F 1/00* (2006.01)
*H01B 1/22* (2006.01)
*B22F 7/06* (2006.01)
*B22F 7/08* (2006.01)
*H01L 21/52* (2006.01)
*C22C 1/05* (2006.01)
*H01L 23/051* (2006.01)

(56) References Cited

U.S. PATENT DOCUMENTS

| | | | |
|---|---|---|---|
| 2003/0102553 A1* | 6/2003 | Ishikawa | H01L 23/3735 |
| | | | 257/707 |
| 2012/0003465 A1 | 1/2012 | Rittner et al. | |
| 2012/0061815 A1 | 3/2012 | Sontheimer et al. | |
| 2013/0277096 A1 | 10/2013 | Seong et al. | |
| 2018/0114609 A1* | 4/2018 | Tomura | C09D 1/00 |
| 2018/0297154 A1* | 10/2018 | Yamagami | B23K 35/3613 |
| 2019/0019594 A1* | 1/2019 | Ishii | C22C 9/06 |

FOREIGN PATENT DOCUMENTS

| | | |
|---|---|---|
| JP | 2014-107368 A | 6/2014 |
| JP | 2014-127535 A | 7/2014 |
| WO | 2015/060173 A1 | 4/2015 |

* cited by examiner

ONLY Ag PARTICLE

Ag PARTICLE AND $WO_3$ PARTICLE

Ag PARTICLE AND WC PARTICLE

SEMICONDUCTOR DEVICE

CROSS REFERENCE TO RELATED APPLICATION

The present application is a continuation application of International Patent Application No. PCT/JP2017/039798 filed on Nov. 2, 2017, which designated the U.S. and claims the benefit of priority from Japanese Patent Application No. 2016-219745 filed on Nov. 10, 2016. The entire disclosures of all of the above applications are incorporated herein by reference.

TECHNICAL FIELD

The present disclosure relates to a semiconductor device in which a mounting member having an electrode is connected to a conductive member via a bonding member.

BACKGROUND

Conventionally, the following semiconductor devices are proposed as this type of semiconductor device. That is, in this semiconductor device, a semiconductor chip is used as a mounting member, and an electrode is arranged on the semiconductor chip. The semiconductor chip is arranged such that the electrode faces the conductive member, and the electrode is electrically connected to the conductive member via the bonding member. The bonding member is made of an Ag sintered body in which only silver (hereinafter simply referred to as Ag) particles are sintered.

SUMMARY

A semiconductor device includes: a mounting member having an electrode; a conductive member facing the electrode; and a bonding member electrically and mechanically connecting the electrode and the conductive member. The bonding member is made of a sintered body in which an additive particle including a metal atom having aggregation energy higher than a silver atom is added to an silver particle.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 7A:
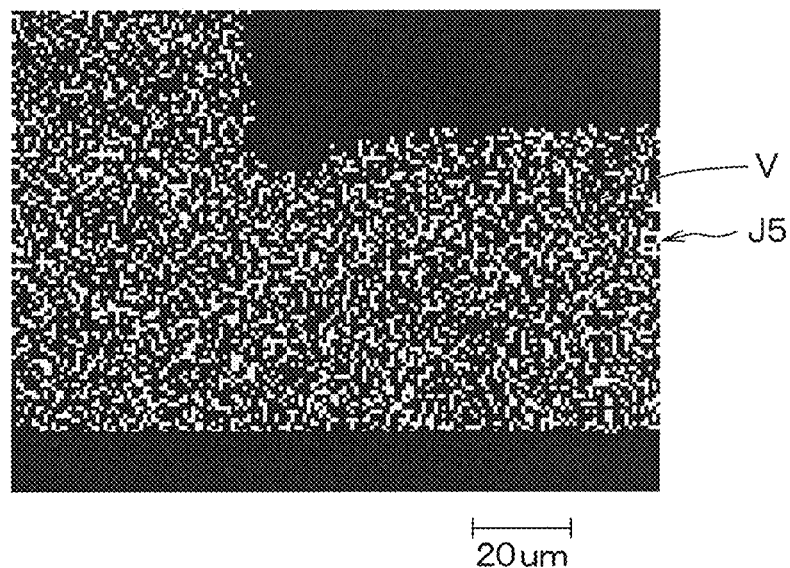
FIG. 7A is a diagram showing a binarized view of an initial state of the conventional bonding member constituted only by the Ag particle, based on a SEM photograph.
Figure 7B:
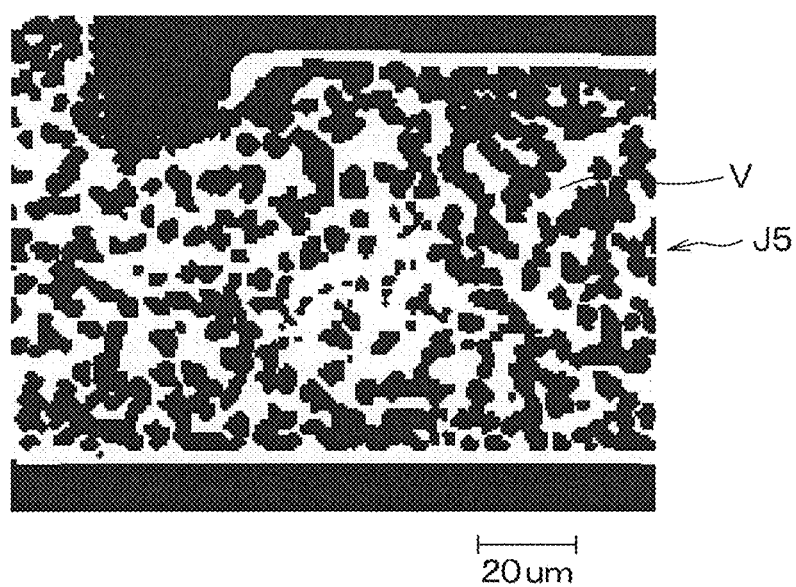
FIG. 7B is a diagram showing a binarized view of a state of the conventional bonding member constituted only by the Ag particle after holding at 250° C. for 500 hours, based on a SEM photograph.

The inventors have studied a semiconductor device having a bonding member made of such an Ag sintered body. As a result, when the semiconductor device is held at a high temperature for a long time, large voids are formed in the bonding member. That is, as shown in FIGS. 7A and 7B, in the case where the bonding member J5 is constituted of an Ag sintered body, even in the initial state, there is a micro void V. After the device is held at a high temperature for a long time, it is confirmed that a large number of large voids V are formed. It is presumed that this phenomenon is caused by diffusion of Ag particles (that is, Ag atoms) as the bonding member is held at high temperature for a long time. For this reason, in such a use environment where such a semiconductor device is held at a high temperature for a long time, the bonding strength of the bonding member may be lowered and there may be a possibility that the bonding member would be deteriorated.

In an example embodiment, a semiconductor device is provided with suppressing deterioration of a bonding member even when the device is held at high temperature for a long time.

According to an example embodiment, a semiconductor device includes: a mounting member having an electrode; a conductive member disposed to face the electrode; and a bonding member disposed between the mounting member and the conductive member and electrically and mechanically connecting the electrode and the conductive member. The bonding member is made of a sintered body in which an additive particle including a metal atom having aggregation energy higher than a silver atom is added to a silver particle.

According to this, since the bonding member is made of a sintered body in which the additive particle including the metal atom having the aggregation energy higher than the silver atom is added, even when being used for a long time at high temperature, diffusion of the silver atom is suppressed by the metal atom in the additive particle. Therefore, in the semiconductor device, it is possible to prevent the bonding strength from being lowered by the large void formed inside the bonding member, and it is possible to suppress deterioration of the bonding member.

Hereinafter, embodiments of the present disclosure will be described with reference to the drawings. In the following embodiments, the same or equivalent parts are denoted by the same reference numerals.

First Embodiment

Figure 1:
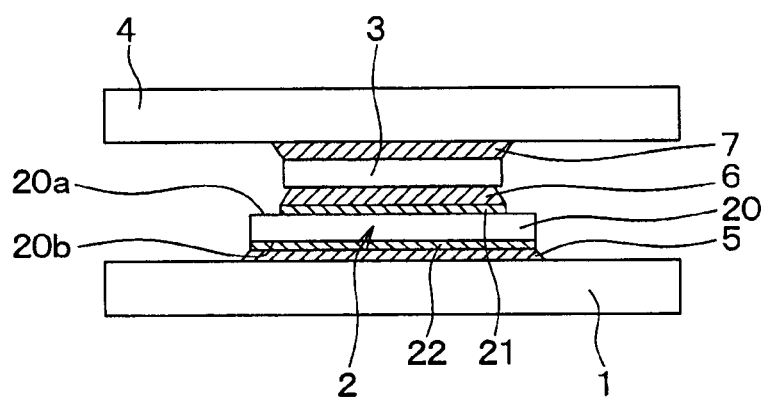
FIG. 1 is a cross-sectional view of a semiconductor device in a first embodiment.

A first embodiment will be described with reference to the drawings. In the semiconductor device of this embodiment, as shown in FIG. 1, a semiconductor chip 2 is mounted on a first heat radiation member 1, and a second heat radiation member 4 is disposed on the semiconductor chip 2 via a heat radiation block 3. In addition, a first bonding member 5 is disposed between the first heat radiation member 1 and the semiconductor chip 2. Between the semiconductor chip 2 and the heat radiation block 3, the second bonding member 6 is disposed. A third bonding member 7 is disposed between the heat radiation block 3 and the second heat radiation member 4.

In the present embodiment, the first heat radiation member 1 and the heat radiation block 3 correspond to a conductive member, the semiconductor chip 2 corresponds to a mounting member, and the first bonding member 5 and the second bonding member 6 correspond to a bonding member.

In the present embodiment, the semiconductor chip 2 includes a semiconductor substrate 20 having one surface 20a and another surface 20b opposite to the one surface 20a. On the semiconductor substrate 20, semiconductor elements such as an insulated gate bipolar transistor (i.e., IGBT) and a MOSFET (i.e., metal oxide semiconductor field effect transistor) are formed. On the semiconductor substrate 20, a one-surface electrode 21 to be electrically connected to the semiconductor element is formed on the side of the one surface 20a, and another side electrode 22 electrically connected to the semiconductor element is formed on the side of the other surface 20b. Although not specifically shown, a gate pad is formed on the side of the surface 20a of the semiconductor substrate 20, and the gate pad is electrically connected to the gate terminal via a bonding wire.

The heat radiation block 3 is disposed between the semiconductor chip 2 and the second heat radiation member 4 to electrically and thermally connect the semiconductor chip 2 and the second heat radiation member 4. For example, the heat radiation block 3 is made of copper (i.e., Cu) having high electric conductivity and high heat transfer coefficient, or the like. In the present embodiment, the heat radiation block 3 has a rectangular shape. The heat radiation block 3 is electrically, thermally and mechanically connected to the one surface electrode 21 on the one surface 20a side of the semiconductor chip 2 via the second bonding member 6, and is electrically, thermally, and mechanically connected to the second heat radiation member 4 via the third bonding member 7.

The first heat radiation member 1 and the second heat radiation member 4 function as a heat radiation plate that diffuses and radiates the heat generated in the semiconductor chip 2 over a wide range. For example, the first heat radiating member 1 and the second heat radiating member 4 are formed of copper having high electric conductivity and high heat transfer coefficient as a base, and have a structure in which gold plating or the like is applied to the surface thereof, if necessary.

The first heat radiation member 1 is electrically, thermally and mechanically connected to the other surface electrode 22 of the semiconductor chip 2 via the first bonding member 5, and, in addition to the function as a heat radiation plate, also functions as a wiring connected to the other surface electrode 22. Similarly, the second heat radiation member 4 is electrically connected to the one surface electrode 21 of the semiconductor chip 2 via the heat radiation block 3, and, in addition to the function as a heat radiation plate, the second heat radiation member 4 functions as a wiring connected to the one surface electrode 21.

The above is the basic configuration of the semiconductor device of the present embodiment. Next, the configuration of the first bonding member 5 of the present embodiment will be described. In the present embodiment, the second bonding member 6 and the third bonding member 7 also have the same structure as the first bonding member 5.

Figure 2:
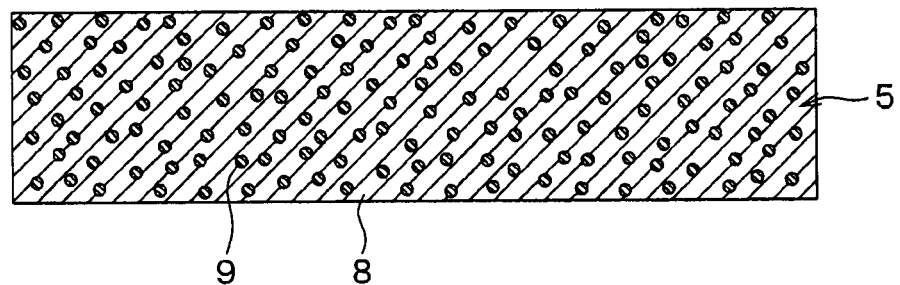
FIG. 2 is a schematic view showing a configuration of a first bonding member shown in FIG. 1.
Figure 3A:
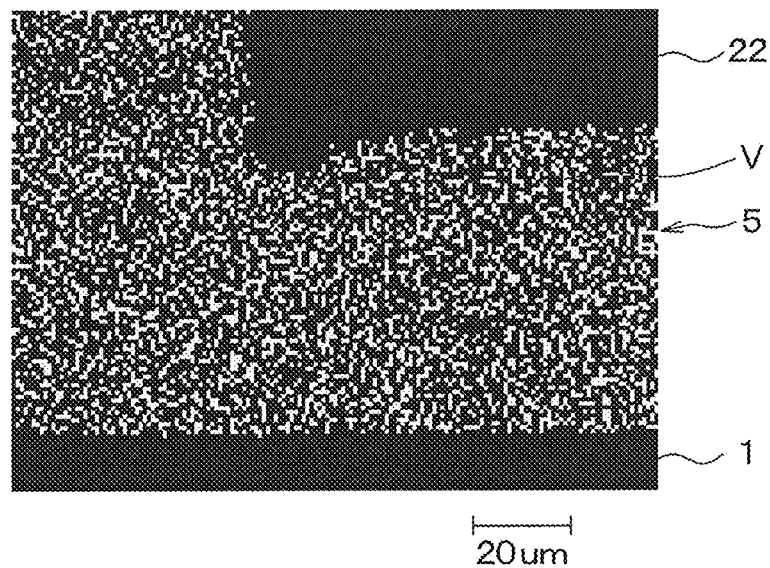
FIG. 3A is a diagram showing a binarized view of an initial state of the first bonding member made of the silver particle with adding a $WO_3$ particle, based on a SEM photograph.
Figure 3B:
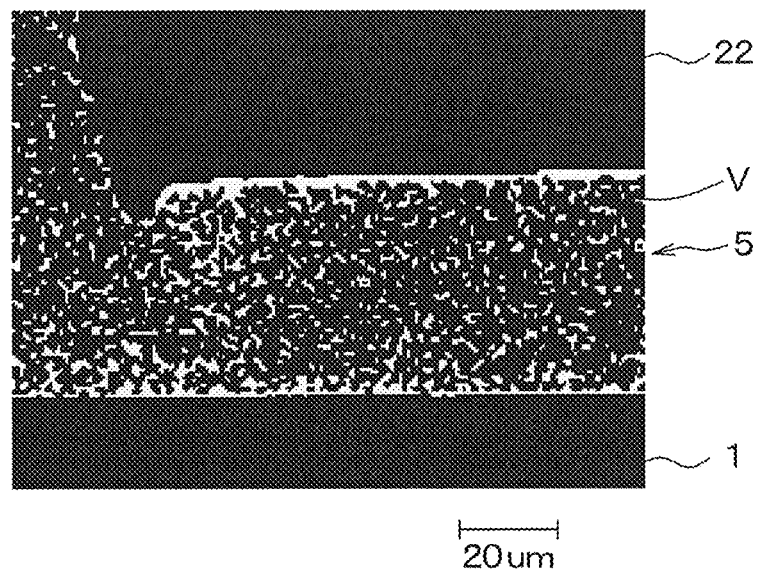
FIG. 3B is a diagram showing a binarized view of a state of the first bonding member made of the silver particle with adding the $WO_3$ particle after holding at 250° C. for 500 hours, based on the SEM photograph.
Figure 4A:
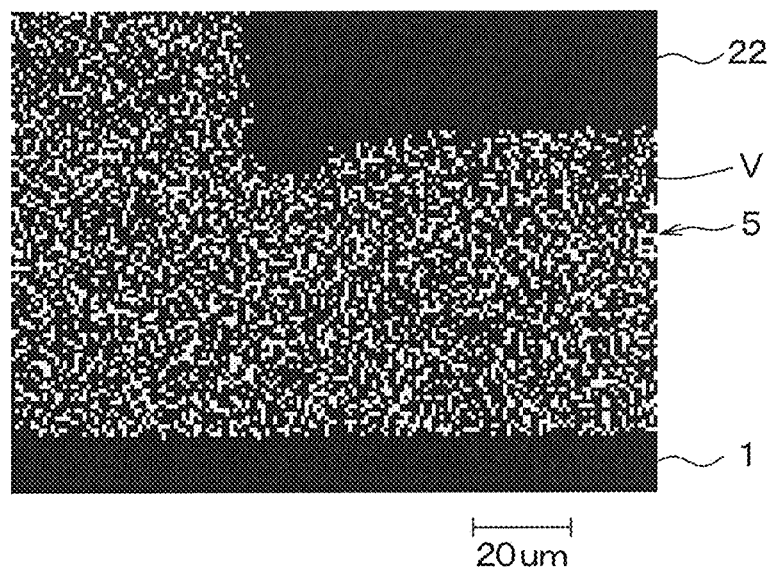
FIG. 4A is a diagram showing a binarized view of an initial state of the first bonding member made of the silver particle with adding a WC particle, based on a SEM photograph.
Figure 4B:
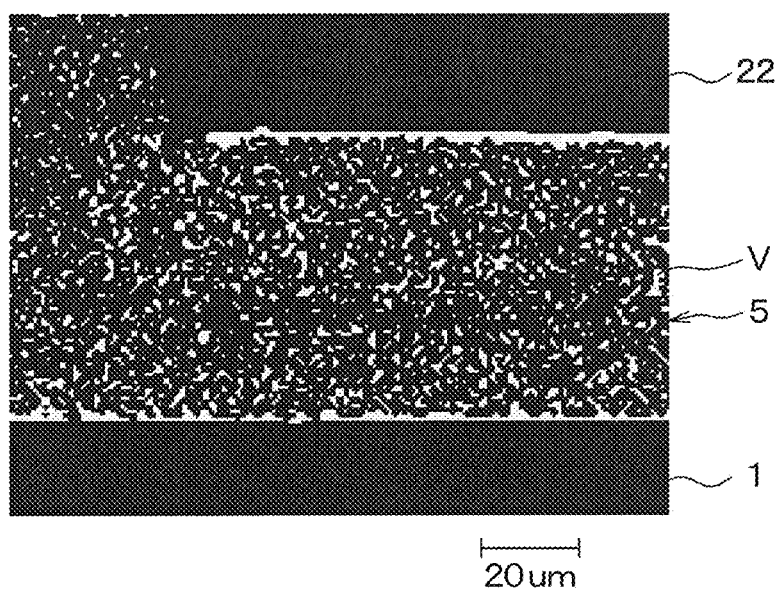
FIG. 4B is a diagram showing a binarized view of a state of the first bonding member made of the silver particle with adding the WC particle after holding at 250° C. for 500 hours, based on the SEM photograph.
Figure 5:
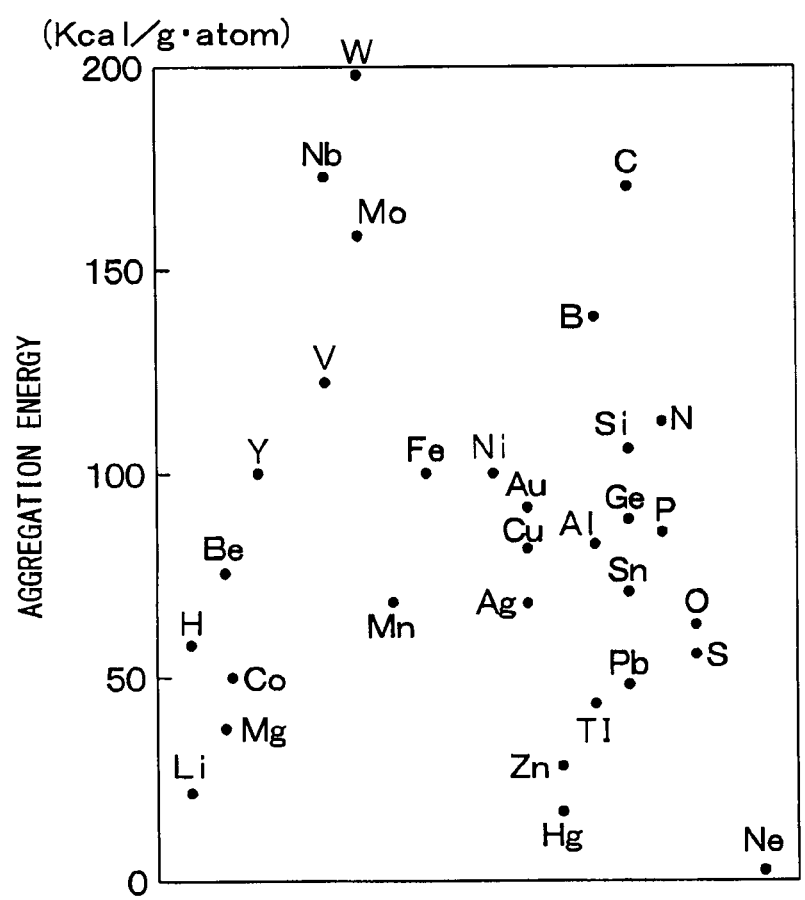
FIG. 5 is a diagram showing a relationship between an atom and aggregation energy.

As shown in FIG. 2, the first bonding member 5 is made of a sintered body in which the additive particles 9 is added to the Ag particles 8, and the additive particles 9 is made of an oxide or carbide of tungsten (hereinafter simply referred to as W) having higher aggregation energy than Ag atoms constituting the Ag particles 8. That is, as shown in FIG. 7B, when the bonding member J5 made of a sintered body including only Ag particles is held at a high temperature for a long time, a large void V is formed inside thereof. Therefore, the present inventors consider that diffusion of Ag atoms is suppressed by adding additive particles including metal atoms having higher aggregation energy than Ag atoms to the Ag particles, and the experimental results shown in FIG. 3A, FIG. 3B, FIG. 4A and FIG. 4B are obtained. FIGS. 3A and 3B show the experimental results in a case where tungsten oxide (hereinafter simply referred to as $WO_3$) powder having an average particle size of about 0.9 µm is added by 2 wt % to the powder of the Ag particle 8 having an average particle diameter of about 1 µm to 10 µm. FIGS. 4A and 4B show the experimental results in a case where tungsten carbide (hereinafter simply referred to as WC) powder having an average particle size of about 0.11 µm is added by 2 wt % to the powder of the Ag particle 8 having an average particle diameter of about 1 µm to 10 µm. As shown in FIG. 5, W is a metal atom whose aggregation energy is significantly higher than the aggregation energy of the Ag atom.

As shown in FIG. 3A, FIG. 3B, FIG. 4A and FIG. 4B, in the case where the first bonding member 5 is constituted by adding $WO_3$ or WC additive particles 9 to the Ag particles 8, the following results are obtained. That is, even when the first bonding member 5 is held at 250° C. for 500 hours, it is confirmed that a large void V is not formed, compared with the initial state void V. In the following description, the state after holding at 250° C. for 500 hours is also referred to as after duration state.

Figure 6A:
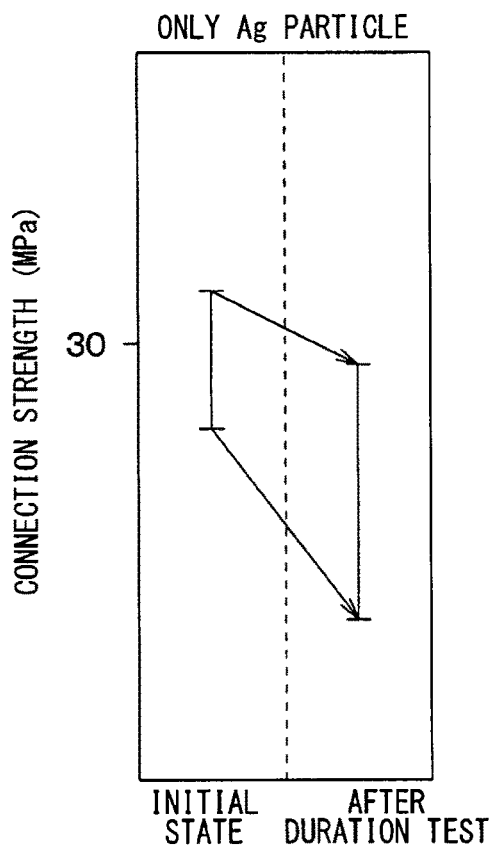
FIG. 6A is a diagram showing a change in bonding strength of a conventional bonding member constituted only by the Ag particle.
Figure 6B:
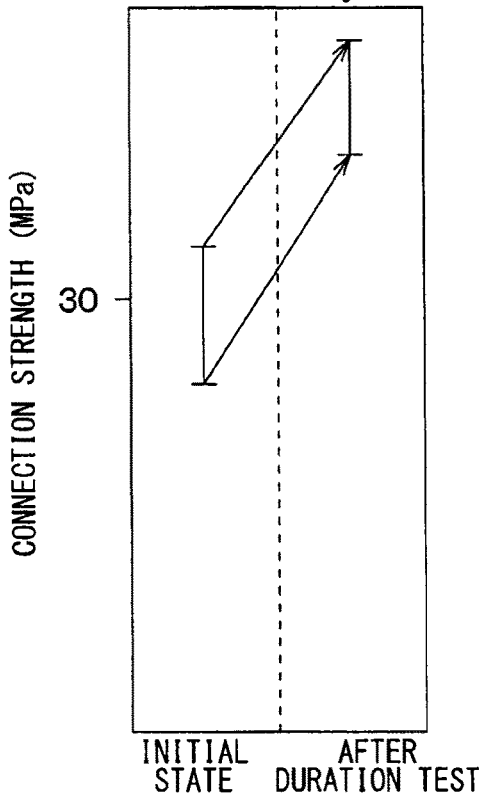
FIG. 6B is a diagram showing a change in bonding strength of the first bonding member constituted by the Ag particle with adding the $WO_3$ particle.

Further, as shown in FIG. 6A, it is confirmed that the bonding strength of the bonding member including only the Ag particles in the after duration state is lower than the initial state. On the other hand, as shown in FIG. 6B, it is confirmed that the first bonding member 5 formed by adding the $WO_3$ particles to the Ag particles 8 can suppress the reduction in bonding strength in the after duration state, as compared with the initial state. Similarly, as shown in FIG. 6C, it is also confirmed that the first bonding member 5 formed by adding the WC particles to the Ag particles 8 can also suppress the reduction in the bonding strength in the after duration state, compared to the initial state.

From these drawings, it is confirmed that, when the first bonding member 5 is formed by adding the additive particles 9 including W atoms having higher aggregation energy than Ag atoms to the Ag particles 8, the formation of a large void V inside thereof is restricted and the decrease in the bonding strength is suppressed. This result is presumed to be due to aggregation of Ag atoms around W atoms by adding the additive particles 9 including W atoms having higher aggregation energy than Ag atoms.

In the present embodiment, the additive particles 9 are made of tungsten oxide or tungsten carbide. Therefore, as compared with the case where only W particles (that is, W atoms) are added, Ag atoms can be easily aggregated around W atoms by the reduction action of Ag atoms.

Figure 6C:
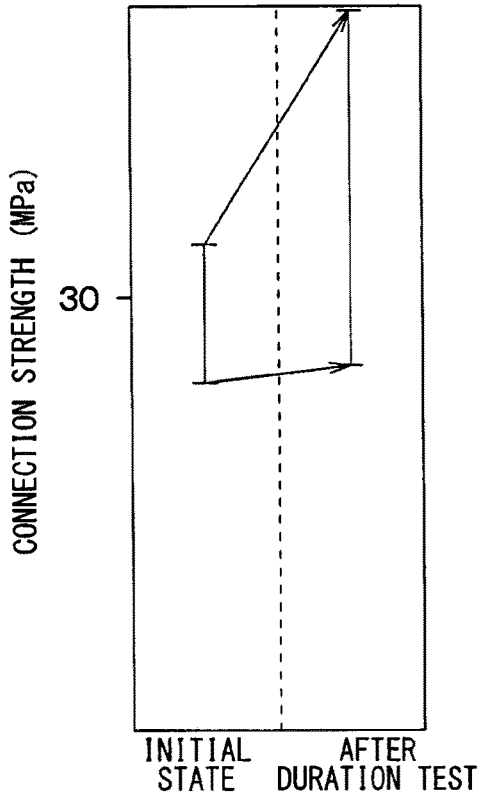
FIG. 6C is a diagram showing a change in bonding strength of the first bonding member constituted by the Ag particle with adding the WC particle.

Furthermore, as shown in FIGS. 6B and 6C, when the first bonding member 5 is configured by adding the additive particles 9 to the Ag particles 8, it is confirmed that not only the suppression of the decrease in the bonding strength but also the improvement of the bonding strength are obtained. Regarding this, although clear mechanism is figured out, when Ag atoms aggregate around W atoms, as shown in FIGS. 3B and 4 B, it is presumed that micro voids V formed in the initial state may be buried.

The average particle size of the additive particles 9 to be added is preferably smaller than the average particle diameter of the Ag particles 8 so that no void V is formed between the additive particles 9 and the Ag particles 8. Although not particularly limited, it is preferable to set the average particle size of the Ag particles 8 to be in a range between 1 μm and 10 μm, and the average particle diameter of the additive particles 9 to be in a range between 0.1 μm and 3 μm, for example. By doing so, formation of large voids V between the Ag particles 8 and the additive particles 9 in the initial state can be suppressed, and it is possible to suppress a decrease in the bonding strength.

The above is the configuration of the semiconductor device in this embodiment. Note that such first to third bonding members 5 to 7 are created as follows. That is, first, a paste material in which Ag particles 8 are mixed in a solvent such as alcohol or ethylene glycol is prepared, and the additive particles 9 having a smaller average particle size than the Ag particles 8 are added and stirred. Then, after applying the paste including the additive particles 9 to a predetermined portion, sintering is performed, for example, at 280° C. for 1 hour in an air atmosphere or a nitrogen atmosphere.

As described above, in the present embodiment, the first to third bonding members 5 to 7 are formed by adding the additive particles 9 made of the oxide of W or the carbide of W to the Ag particles 8. Therefore, as shown in FIGS. 3A, 3 B, 4 A, 4 B, 6 B, and 6 C, even when the first to third bonding members 5 to 7 are held for a long time at high temperature, generation of large voids V in the first to third bonding members 5 to 7 can be suppressed. Therefore, the bonding strength of the first to third bonding members 5 to 7 are prevented from being lowered, and the bonding members are prevented from being broken.

As the additive particles 9, an oxide of W or an additive of W is used. Therefore, as compared with the case where only the W particles are added as the additive particles 9, in the first to third bonding members 5 to 7, the Ag atoms are easily aggregated around W atoms by the reduction action of Ag atoms.

Furthermore, the average particle diameter of the additive particles 9 is made smaller than the average particle diameter of the Ag particles 8. Therefore, in the initial state, the first to third bonding members 5 to 7 can suppress the formation of large voids V between the Ag particles 8 and the additive particles 9, and suppress the reduction in bonding strength.

Other Embodiments

Although the present disclosure has been described in accordance with the embodiments, it is understood that the present disclosure is not limited to such embodiments or structures. The present disclosure encompasses various modifications and variations within the scope of equivalents. Furthermore, various combinations and formations, and other combinations and formations including one or more than one or less than one element may be included in the scope and the spirit of the present disclosure.

For example, in the first embodiment, W is taken as an example of a metal atom having higher aggregation energy than Ag atom. Alternatively, other metal atoms may be used as long as the aggregation energy is higher than that of Ag atom. It is assumed that the diffusion of Ag atoms is suppressed as the aggregation energy is higher than that of Ag atoms. Therefore, as shown in FIG. 5, the additive particles 9 may preferably include atoms having significantly higher aggregation energy than Ag atoms, such as W, niobium (i.e., Nb), molybdenum (i.e., Mo), and vanadium (i.e., V). Alternatively, in the first embodiment, the additive particles 9 may be made of only metal atoms, not oxides or carbides of metal atoms having higher aggregation energy than Ag atoms. When selecting the additive particles 9, it is preferable to select material of which the characteristics are not largely changed when the material reacts with Ag atoms. For example, it is assumed that chloride reacts with Ag atoms, and becomes a powder state, so that the chloride does not function as a bonding member.

Further, in the first embodiment, the second heat radiation member 4 may be disposed on the semiconductor chip 2 via the second bonding member 6 without arranging the heat radiation block 3. In this case, the second heat radiation member 4 corresponds to a conductive member.

Furthermore, in the semiconductor device according to the first embodiment, as long as at least one electrode of the one surface electrode 21 and the other surface electrode 22 of the semiconductor chip 2 is connected to the conductive members 1, 3 via the bonding members 5, 6, other configurations may be changed as appropriate.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device in which a mounting member having an electrode is electrically and mechanically connected to a conductive member via a bonding member, the semiconductor device comprising:
   the mounting member having the electrode;
   the conductive member disposed to face the electrode; and
   the bonding member disposed between the mounting member and the conductive member and electrically and mechanically connecting the electrode and the conductive member, wherein:
   the bonding member is made of a sintered body in which an additive particle including a metal atom having aggregation energy higher than a silver atom is added to an silver particle; and
   the additive particles are made of an oxide or a carbide of the metal atom.

2. The semiconductor device according to claim 1, wherein:
   the additive particle has an average particle diameter smaller than the silver particle.

3. The semiconductor device according to claim 1, wherein:

the metal atom is at least one of tungsten, molybdenum, niobium, or vanadium.

4. A method for manufacturing a semiconductor device including a mounting member having an electrode, a conductive member facing the electrode, and a bonding member, disposed between the mounting member and the conductive member and electrically and mechanically connecting the electrode and the conductive member, the bonding member made of a sintered body in which an additive particle including a metal atom having aggregation energy higher than a silver atom is added to an silver particle, and the additive particles made of an oxide or a carbide of the metal atom, the method comprising:
preparing a paste material in which the additive particle is added to the silver particle;
applying the paste material to a predetermined portion of the semiconductor device; and
sintering the paste material to provide the bonding member.

* * * * *